United States Patent
Khlat

(10) Patent No.: US 11,757,430 B2
(45) Date of Patent: Sep. 12, 2023

(54) ACOUSTIC FILTER CIRCUIT FOR NOISE SUPPRESSION OUTSIDE RESONANCE FREQUENCY

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 366 days.

(21) Appl. No.: 17/141,678

(22) Filed: Jan. 5, 2021

(65) Prior Publication Data
US 2021/0211116 A1 Jul. 8, 2021

Related U.S. Application Data

(60) Provisional application No. 62/957,985, filed on Jan. 7, 2020.

(51) Int. Cl.
*H03H 9/54* (2006.01)
*H03H 9/13* (2006.01)
(Continued)

(52) U.S. Cl.
CPC ........ *H03H 9/542* (2013.01); *H03H 9/02015* (2013.01); *H03H 9/131* (2013.01); *H03H 9/205* (2013.01)

(58) Field of Classification Search
CPC .... H03H 9/542; H03H 9/02015; H03H 9/131; H03H 9/205; H03H 7/09; H03H 9/584; H03H 9/585
(Continued)

(56) References Cited

U.S. PATENT DOCUMENTS 3,731,230 A 5/1973 Cerny, Jr.
3,875,533 A 4/1975 Irwin et al.
(Continued)

FOREIGN PATENT DOCUMENTS

CN 111917392 A 11/2020
JP 2002251190 A 9/2002
(Continued)

OTHER PUBLICATIONS

Notice of Allowance for U.S. Appl. No. 17/088,872, dated Dec. 14, 2022, 7 pages.
(Continued)

*Primary Examiner* — Rakesh B Patel
*Assistant Examiner* — Jorge L Salazar, Jr.
(74) *Attorney, Agent, or Firm* — Withrow & Terranova, P.L.L.C.

(57) ABSTRACT

An acoustic filter circuit for noise suppression outside resonance frequency is provided. The acoustic filter circuit includes a first filter branch and a second filter branch. The first filter branch and the second filter branch are both configured to resonate at a resonance frequency to pass a radio frequency (RF) signal, but in opposite phases. The acoustic filter circuit also includes a shunt circuit coupled between the first filter branch and the second filter branch. As discussed in various embodiments in the detailed description, the shunt circuit can be configured to protect the RF signal located inside the resonance frequency and suppress noises located outside the resonance frequency. As such, the acoustic filter circuit can provide improved noise rejection and reduce insertion loss.

20 Claims, 9 Drawing Sheets

(51) Int. Cl.
  *H03H 9/02* (2006.01)
  *H03H 9/205* (2006.01)

(58) Field of Classification Search
  USPC .................................... 333/133, 186, 187
  See application file for complete search history.

(56) References Cited

U.S. PATENT DOCUMENTS

| | | | |
|---|---|---|---|
| 4,442,434 | A | 4/1984 | Baekgaard |
| 4,577,168 | A | 3/1986 | Hailmann |
| 5,291,159 | A | 3/1994 | Vale |
| 5,821,833 | A | 10/1998 | Lakin |
| 6,067,391 | A | 5/2000 | Land |
| 6,246,153 | B1 | 6/2001 | Bishop et al. |
| 6,472,953 | B1 | 10/2002 | Sakuragawa et al. |
| 6,670,866 | B2 | 12/2003 | Ellaet et al. |
| 6,671,016 | B1 | 12/2003 | Kim |
| 6,714,099 | B2 | 3/2004 | Hikita et al. |
| 6,720,844 | B1 | 4/2004 | Lakin |
| 6,927,649 | B2 | 8/2005 | Metzger et al. |
| 6,927,651 | B2 | 8/2005 | Larson, III et al. |
| 6,975,183 | B2 | 12/2005 | Aigner et al. |
| 7,057,478 | B2 | 6/2006 | Korden et al. |
| 7,173,504 | B2 | 2/2007 | Larson, III et al. |
| 7,239,067 | B2 | 7/2007 | Komuro et al. |
| 7,321,183 | B2 | 1/2008 | Ebuchi et al. |
| 7,333,831 | B2 | 2/2008 | Srinivasan et al. |
| 7,342,351 | B2 | 3/2008 | Kubo et al. |
| 7,367,095 | B2 | 5/2008 | Larson, III et al. |
| 7,391,285 | B2 | 6/2008 | Larson, III et al. |
| 7,436,269 | B2 | 10/2008 | Wang et al. |
| 7,459,990 | B2 | 12/2008 | Wunnicke et al. |
| 7,515,018 | B2 | 4/2009 | Handtmann et al. |
| 7,804,374 | B1 | 9/2010 | Brown et al. |
| 7,825,749 | B2 | 11/2010 | Fhalhammer et al. |
| 7,855,618 | B2 | 12/2010 | Frank et al. |
| 7,889,024 | B2 | 2/2011 | Bradley et al. |
| 7,898,493 | B1 | 3/2011 | Rojas et al. |
| 7,956,705 | B2 | 6/2011 | Meister et al. |
| 7,973,620 | B2 | 7/2011 | Shirakawa et al. |
| 8,026,776 | B2 | 9/2011 | Ueda et al. |
| 8,248,185 | B2 | 8/2012 | Choy et al. |
| 8,508,315 | B2 | 8/2013 | Jamneala et al. |
| 8,575,820 | B2 | 11/2013 | Shirakawa et al. |
| 8,576,024 | B2 | 11/2013 | Erb et al. |
| 8,923,794 | B2 | 12/2014 | Aigner |
| 8,981,627 | B2 | 3/2015 | Sakuma et al. |
| 8,991,022 | B2 | 3/2015 | Satoh et al. |
| 9,054,671 | B2 | 6/2015 | Adkisson et al. |
| 9,054,674 | B2 | 6/2015 | Inoue et al. |
| 9,197,189 | B2 | 11/2015 | Miyake |
| 9,243,316 | B2 | 1/2016 | Larson, III et al. |
| 9,484,883 | B2 | 11/2016 | Nishizawa et al. |
| 9,698,752 | B2 | 7/2017 | Burgener et al. |
| 9,698,756 | B2 | 7/2017 | Khlat et al. |
| 9,837,984 | B2 | 12/2017 | Khlat et al. |
| 9,847,769 | B2 | 12/2017 | Khlat et al. |
| 9,887,686 | B2 | 2/2018 | Kuwahara |
| 9,929,716 | B2 | 3/2018 | Lee et al. |
| 9,985,605 | B2 | 5/2018 | Tani et al. |
| 10,009,001 | B2 | 6/2018 | Jiang et al. |
| 10,141,644 | B2 | 11/2018 | Khlat et al. |
| 10,284,174 | B2 | 5/2019 | Khlat et al. |
| 2002/0109564 | A1 | 8/2002 | Tsai et al. |
| 2004/0100342 | A1 | 5/2004 | Nishihara et al. |
| 2004/0263286 | A1 | 12/2004 | Unterberger |
| 2005/0057117 | A1 | 3/2005 | Nakatsuka et al. |
| 2005/0093648 | A1 | 5/2005 | Inoue |
| 2005/0206476 | A1 | 9/2005 | Ella et al. |
| 2006/0091978 | A1 | 5/2006 | Wang et al. |
| 2006/0232361 | A1* | 10/2006 | Wang .................. H03H 3/02 333/191 |
| 2007/0024392 | A1 | 2/2007 | Inoue et al. |
| 2008/0007369 | A1 | 1/2008 | Barber et al. |
| 2008/0055020 | A1 | 3/2008 | Handtmann et al. |
| 2008/0169884 | A1 | 7/2008 | Matsumoto et al. |
| 2008/0272853 | A1 | 11/2008 | Heinze et al. |
| 2008/0297278 | A1 | 12/2008 | Handtmann et al. |
| 2009/0096549 | A1 | 4/2009 | Thalhammer et al. |
| 2009/0096550 | A1 | 4/2009 | Handtmann et al. |
| 2009/0273415 | A1 | 11/2009 | Frank et al. |
| 2010/0277237 | A1 | 11/2010 | Sinha et al. |
| 2011/0115334 | A1 | 5/2011 | Konishi et al. |
| 2011/0121689 | A1 | 5/2011 | Grannen et al. |
| 2011/0204995 | A1 | 8/2011 | Jamneala et al. |
| 2011/0210787 | A1 | 9/2011 | Lee et al. |
| 2012/0007696 | A1 | 1/2012 | Pang et al. |
| 2012/0187799 | A1 | 7/2012 | Nakahashi |
| 2012/0313725 | A1 | 12/2012 | Ueda et al. |
| 2013/0033150 | A1 | 2/2013 | Bardong et al. |
| 2013/0113576 | A1 | 5/2013 | Inoue et al. |
| 2013/0193808 | A1 | 8/2013 | Feng et al. |
| 2014/0085020 | A1 | 3/2014 | Reinhardt et al. |
| 2014/0125203 | A1 | 5/2014 | Choy et al. |
| 2014/0132117 | A1 | 5/2014 | Larson, III |
| 2014/0145557 | A1 | 5/2014 | Tanaka |
| 2014/0167565 | A1 | 6/2014 | Iwamoto |
| 2015/0054387 | A1 | 2/2015 | Li |
| 2015/0222246 | A1 | 8/2015 | Nosaka |
| 2015/0280100 | A1 | 10/2015 | Burak et al. |
| 2015/0369153 | A1 | 12/2015 | Tsunooka et al. |
| 2016/0028364 | A1 | 1/2016 | Takeuchi |
| 2016/0056789 | A1 | 2/2016 | Otsubo et al. |
| 2016/0191012 | A1 | 6/2016 | Khlat et al. |
| 2016/0191014 | A1 | 6/2016 | Khlat et al. |
| 2016/0191016 | A1 | 6/2016 | Khlat et al. |
| 2016/0261235 | A1 | 9/2016 | Ortiz |
| 2016/0268998 | A1 | 9/2016 | Xu et al. |
| 2016/0308576 | A1 | 10/2016 | Khlat et al. |
| 2016/0359468 | A1 | 12/2016 | Taniguchi et al. |
| 2017/0093369 | A1 | 3/2017 | Khlat et al. |
| 2017/0093370 | A1 | 3/2017 | Khlat et al. |
| 2017/0141757 | A1 | 5/2017 | Schmidhammer |
| 2017/0201233 | A1 | 7/2017 | Khalt |
| 2017/0301992 | A1 | 10/2017 | Khlat et al. |
| 2017/0310302 | A1 | 10/2017 | Bauder et al. |
| 2017/0324159 | A1 | 11/2017 | Khlat |
| 2017/0338795 | A1 | 11/2017 | Nakagawa et al. |
| 2018/0013402 | A1 | 1/2018 | Kirkpatrick et al. |
| 2018/0019731 | A1 | 1/2018 | Tsukamoto et al. |
| 2018/0041191 | A1 | 2/2018 | Park |
| 2018/0076793 | A1 | 3/2018 | Khlat et al. |
| 2018/0076794 | A1 | 3/2018 | Khlat et al. |
| 2018/0109236 | A1 | 4/2018 | Konoma |
| 2018/0109237 | A1 | 4/2018 | Wasilik et al. |
| 2018/0145658 | A1 | 5/2018 | Saji |
| 2018/0219530 | A1 | 8/2018 | Khlat et al. |
| 2018/0241418 | A1 | 8/2018 | Takamine et al. |
| 2018/0358947 | A1 | 12/2018 | Mateu et al. |
| 2019/0103851 | A1 | 4/2019 | Yusuf |
| 2019/0140618 | A1 | 5/2019 | Takamine |
| 2019/0181824 | A1 | 6/2019 | Timme et al. |
| 2019/0181834 | A1 | 6/2019 | Bauder et al. |
| 2019/0181835 | A1 | 6/2019 | Timme et al. |
| 2019/0199320 | A1 | 6/2019 | Morita et al. |
| 2019/0207583 | A1 | 7/2019 | Miura et al. |
| 2019/0222197 | A1 | 9/2019 | Saji |
| 2019/0288664 | A1 | 9/2019 | Saji |
| 2019/0305752 | A1 | 10/2019 | Sadhu et al. |
| 2020/0099360 | A1 | 3/2020 | Khlat |
| 2020/0099362 | A1 | 3/2020 | Khlat |
| 2020/0099363 | A1 | 3/2020 | Khlat |
| 2020/0099364 | A1 | 3/2020 | Khlat |
| 2020/0136589 | A1 | 4/2020 | Khlat |
| 2021/0028755 | A1 | 1/2021 | Yusuf |
| 2021/0218385 | A1 | 7/2021 | Yusuf et al. |
| 2021/0218386 | A1 | 7/2021 | Yusuf et al. |
| 2022/0069800 | A1 | 3/2022 | Han et al. |

FOREIGN PATENT DOCUMENTS

| | | |
|---|---|---|
| JP | 2008085989 A | 4/2008 |
| JP | 2011176744 A | 9/2011 |
| JP | 2012257050 A | 12/2012 |

(56) References Cited

FOREIGN PATENT DOCUMENTS

| JP | 2017045749 A | 3/2017 |
| JP | 2017103654 A | 6/2017 |
| JP | 2018093388 A | 6/2018 |

OTHER PUBLICATIONS

Non-Final Office Action for U.S. Appl. No. 16/356,279, dated Dec. 10, 2021, 9 pages.
Notice of Allowance for U.S. Appl. No. 16/290,175, dated Jun. 14, 2021, 7 pages.
Corrected Notice of Allowability for U.S. Appl. No. 16/290,175, dated Jun. 23, 2021, 4 pages.
Notice of Allowance for U.S. Appl. No. 16/740,667, dated Jun. 11, 2021, 7 pages.
Notice of Allowance for U.S. Appl. No. 16/776,738, dated Jun. 11, 2021, 7 pages.
Notice of Allowance for U.S. Appl. No. 16/806,166, dated Jun. 18, 2021, 7 pages.
Moreira, M. et al., "Aluminum scandium nitride thin-film bulk acoustic resonators for wide band applications," Vacuum, vol. 86, Issue 1, Jul. 2011, Elsevier Ltd., 4 pages.
Zverev, A., "Figure 8.25," Hanbook of Filter Synthesis, 1967, John Wiley & Sons, 4 pages.
Zverev, A., "The Synthesis of Intermediate Bandpass Filters," Hanbook of Filter Synthesis, 1967, John Wiley & Sons, pp. 483-488.
Notice of Allowance and Examiner-Initiated Interview Summary for U.S. Appl. No. 16/722,125, dated Jun. 24, 2022, 10 pages.
Non-Final Office Action for U.S. Appl. No. 17/152,110, dated May 27, 2022, 6 pages.
Extended European Search Report for European Patent Application No. 22150239.6, dated Jun. 9, 2022, 10 pages.
Final Office Action for U.S. Appl. No. 16/385,301, dated Jul. 13, 2022, 16 pages.
Non-Final Office Action for U.S. Appl. No. 16/385,301, dated Apr. 6, 2022, 14 pages.
Notice of Allowance for U.S. Appl. No. 16/356,279, dated Apr. 27, 2022, 7 pages.
Office Action for Japanese Patent Application No. 2018181230, dated Sep. 14, 2022, 9 pages.
Non-Final Office Action for U.S. Appl. No. 17/088,872, dated Aug. 29, 2022, 8 pages.
Notice of Allowance for U.S. Appl. No. 17/152,110, dated Sep. 21, 2022, 7 pages.
Non-Final Office Action for U.S. Appl. No. 14/757,587, dated Sep. 13, 2016, 12 pages.
Notice of Allowance for U.S. Appl. No. 14/757,587, dated Mar. 9, 2017, 8 pages.
Non-Final Office Action for U.S. Appl. No. 15/004,084, dated Jun. 12, 2017, 9 pages.
Non-Final Office Action for U.S. Appl. No. 14/757,651, dated Jun. 9, 2017, 11 pages.
Non-Final Office Action for U.S. Appl. No. 15/275,957, dated Jun. 14, 2017, 9 pages.
Ex Parte Quayle Action for U.S. Appl. No. 15/347,452, mailed Jun. 15, 2017, 7 pages.
Final Office Action for U.S. Appl. No. 15/275,957, dated Jan. 2, 2018, 7 pages.
Author Unknown, "SAW Filters—SAW Resonators: Surface Acoustic Wave SAW Components," Product Specification, 2010, Token Electronics Industry Co., Ltd., 37 pages.
Fattinger, Gernot et al., "Miniaturization of BAW Devices and the Impact of Wafer Level Packaging Technology," Joint UFFC, EFTF and PFM Symposium, Jul. 21-25, 2013, Prague, Czech Republic, IEEE, pp. 228-231.
Kwa, Tom, "Wafer-Level Packaged Accelerometer With Solderable SMT Terminals," IEEE Sensors, Oct. 22-25, 2006, Daegu, South Korea, IEEE, pp. 1361-1364.

Lakin, K. M., "Coupled Resonator Filters," 2002 IEEE Ultrasonics Symposium, Oct. 8-11, 2002, Munich, Germany, 8 pages.
López, Edén Corrales, "Analysis and Design of Bulk Acoustic Wave Filters Based on Acoustically Coupled Resonators," PhD Thesis, Department of Telecommunications and Systems Engineering, Autonomous University of Barcelona, May 2011, 202 pages.
Potter, Bob R. et al., "Embedded Inductors Incorporated in the Design of SAW Module SMT Packaging," Proceedings of the 2002 Ultrasonics Symposium, Oct. 8-11, 2002, IEEE, pp. 397-400.
Schneider, Robert, "High-Q AlN Contour Mode Resonators with Unattached, Voltage-Actuated Electrodes," Thesis, Technical Report No. UCB/EECS-2015-247, Dec. 17, 2015, Electrical Engineering and Computer Sciences, University of California at Berkeley, http://www.eecs.berkeley.edu/Pubs/TechRpts/2015/EECS-2015-247. html, Robert Anthony Schneider, 222 pages.
Shirakawa, A. A., et al., "Bulk Acoustic Wave-Coupled Resonator Filters: Concept, Design, and Application," International Journal of RF and Microwave Computer-Aided Engineering, vol. 21, No. 5, Sep. 2011, 9 pages.
Corrales, Eden, et al., "Design of Three-Pole Bulk Acoustic Wave Coupled Resonator Filters," 38th European Microwave Conference, Oct. 2008, Amsterdam, Netherlands, EuMA, pp. 357-360.
De Paco, Pedro, et al., "Equivalent Circuit Modeling of Coupled Resonator Filters," Transactions on Ultrasonics, Ferroelectrics, and Frequency Control, vol. 55, Issue 9, Sep. 2008, IEEE, pp. 2030-2037.
Lakin, K. M., "Bulk Acoustic Wave Coupled Resonator Filters," International Frequency Control Symposium, 2002, IEEE, pp. 8-14.
Shirakawa, A. A., et al., "Bulk Acoustic Wave Coupled Resonator Filters Synthesis Methodology," European Microwave Conference, Oct. 4-6, 2005, Paris, France, IEEE, 4 pages.
Tosic, Dejan, et al., "Symbolic analysis of immitance inverters," 14th Telecommunications Forum, Nov. 21-23, 2006, Belgrade, Serbia, pp. 584-487.
Non-Final Office Action for U.S. Appl. No. 14/757,651, dated May 8, 2018, 8 pages.
Notice of Allowance for U.S. Appl. No. 15/347,428, dated Jul. 12, 2018, 9 pages.
Notice of Allowance for U.S. Appl. No. 15/490,381, dated May 23, 2018, 8 pages.
Final Office Action for U.S. Appl. No. 14/757,651, dated Sep. 19, 2018, 7 pages.
Non-Final Office Action for U.S. Appl. No. 15/701,759, dated Oct. 4, 2018, 10 pages.
Notice of Allowance for U.S. Appl. No. 15/727,117, dated Mar. 13, 2019, 9 pages.
Non-Final Office Action for U.S. Appl. No. 15/586,374, dated Feb. 26, 2019, 16 pages.
Notice of Allowance for U.S. Appl. No. 15/720,706, dated Mar. 15, 2019, 9 pages.
Non-Final Office Action for U.S. Appl. No. 15/697,658, dated May 1, 2019, 13 pages.
Larson, John, et al., "Characterization of Reversed c-axis AlN Thin Films," International Ultrasonics Symposium Proceedings, 2010, IEEE, pp. 1054-1059.
Notice of Allowance for U.S. Appl. No. 15/586,374, dated Oct. 4, 2019, 7 pages.
Notice of Allowance for U.S. Appl. No. 15/644,922, dated Oct. 21, 2019, 10 pages.
Final Office Action for U.S. Appl. No. 15/697,658, dated Oct. 22, 2019, 9 pages.
Non-Final Office Action for U.S. Appl. No. 15/883,933, dated Oct. 25, 2019, 19 pages.
Non-Final Office Action for U.S. Appl. No. 16/003,417, dated Apr. 3, 2020, 9 pages.
Capilla, Jose et al., "High-Acoustic-Impedance Tantalum Oxide Layers for Insulating Acoustic Reflectors," IEEE Transactions on Ultrasonics, Ferroelectrics, and Frequency Control, vol. 59, No. 3, Mar. 2012, IEEE, pp. 366-372.
Fattinger, Gernot et al., "Single-to-balanced Filters for Mobile Phones using Coupled Resonator BAW Technology," 2004 IEEE

(56) References Cited

OTHER PUBLICATIONS

International Ultrasonics, Ferroelectrics,and Frequency Control Joint 50th Anniversary Conference, Aug. 23-27, 2004, IEEE, pp. 416-419.
Lakin, K. M et al., "High Performance Stacked Crystal Filters for GPS and Wide Bandwidth Applications," 2001 IEEE Ultrasonics Symposium, Oct. 7-10, 2001, IEEE, pp. 833-838.
Roy, Ambarish et al., "Spurious Modes Suppression in Stacked Crystal Filter," 2010 IEEE Long Island Systems, Applications and Technology Conference, May 7, 2010, 6 pages.
Non-Final Office Action for U.S. Appl. No. 16/290,175, dated Apr. 14, 2020, 29 pages.
Ibrahim, A. et al., "Compact Size Microstrip Coupled Resonator Band Pass Filter Loaded with Lumped Capacitors," 2013 Second International Japan-Egypt Conference on Electronics, Communications and Computers (JEC-ECC), Dec. 17-19, 2013, Egypt, IEEE, 4 pages.
Tsai, H. et al., "Tunable Filter by FBAR Using Coupling Capacitors," Proceedings of the 2018 Asia-Pacific Microwave Conference (APMC), Nov. 6-9, 2018, Kyoto, Japan, IEICE, pp. 609-611.
Zhu, L. et al., "Adjustable Bandwidth Filter Design Based on Interdigital Capacitors," IEEE Microwave and Wireless Components Letters, vol. 18, No. 1, Jan. 2008, IEEE, pp. 16-18.
Non-Final Office Action for U.S. Appl. No. 16/283,044, dated Nov. 12, 2020, 9 pages.
Notice of Allowance for U.S. Appl. No. 15/697,658, dated Nov. 17, 2020, 7 pages.
Final Office Action for U.S. Appl. No. 15/883,933, dated Oct. 23, 2020, 15 pages.
Advisory Action for U.S. Appl. No. 15/883,933, dated Dec. 31, 2020, 3 pages.
Notice of Allowance and Examiner-Initiated Interview Summary for U.S. Appl. No. 16/003,417, dated Aug. 5, 2020, 9 pages.
Final Office Action for U.S. Appl. No. 16/290,175, dated Sep. 17, 2020, 13 pages.
Non-Final Office Action for U.S. Appl. No. 16/290,175, dated Jan. 6, 2021, 14 pages.
Aigner, R et al., "3G-4G-5G: How BAW Filter Technology Enables a Connected World," 20th International Conference on Solid-State Sensors, Actuators and Microsystems & Eurosensors XXXIII (Transducers & Eurosensors XXXIII), Jun. 23-27, 2019, Berlin, Germany, IEEE, pp. 523-526.
Kreuzer, S. et al., "Full band 41 filter with high Wi-Fi rejection—design and manufacturing challenges," IEEE International Ultrasonics Symposium (IUS), Oct. 21-24, 2015, Taipei, Taiwan, IEEE, 4 pages.
Volatier, A. et al., "Technology enhancements for high performance BAW duplexer," IEEE International Ultrasonics Symposium (IUS), Jul. 21-25, 2013, Prague, Czech Republic, IEEE, pp. 761-764.
Non-Final Office Action for U.S. Appl. No. 16/740,667, dated Mar. 4, 2021, 10 pages.
Non-Final Office Action for U.S. Patent Application No. 16/776,738, dated Mar. 4, 2021, 7 pages.
Non-Final Office Action for U.S. Appl. No. 16/806,166, dated Mar. 18, 2021, 6 pages.
Karasawa, Rei, et al., "c-Axis zig-zag polarization inverted ScAlN multilayer for FBAR transformer rectifying antenna," IEEE International Ultrasonics Symposium, 2017, Washington, DC, 4 pages.
Larson, John, et al., "Characterization of Reversed c-axis AlN Thin Films," IEEE International Ultrasonics Symposium, San Diego, California, 2010, pp. 1054-1059.
Sussman-Fort, Stephen, "Matching Network Design Using Non-Foster Impedances," Antenna Products and Technologies, EDO Electronic Systems Group, ieee.li/pdf/viewgraphs/matching_network_design_non_foster_impedances, accessed Sep. 10, 2019, Bohemia, New York, 43 pages.
Non-Final Office Action for U.S. Appl. No. 16/358,913, dated May 7, 2020, 9 pages.
Final Office Action for U.S. Appl. No. 16/358,913, dated Sep. 28, 2020, 11 pages.
Notice of Allowance for U.S. Appl. No. 16/358,913, dated Dec. 3, 2020, 7 pages.
Non-Final Office Action for U.S. Appl. No. 16/358,913, dated Jun. 9, 2020, 6 pages.
Notice of Allowance for U.S. Appl. No. 16/358,913, dated Nov. 16, 2020, 7 pages.
Non-Final Office Action for U.S. Appl. No. 16/387,940, dated Sep. 26, 2019, 10 pages.
Notice of Allowance for U.S. Appl. No. 16/387,940, dated Jan. 21, 2020, 7 pages.
Non-Final Office Action for U.S. Appl. No. 16/358,823, dated Apr. 5, 2021, 12 pages.
Non-Final Office Action for U.S. Appl. No. 15/883,933, dated Mar. 29, 2021, 11 pages.
Decision to Grant for Japanese Patent Application No. 2018181230, dated Apr. 13, 2023, 5 pages.
Reason for Rejection for Japanese Patent Application No. 2019058733, dated Mar. 2, 2023, 14 pages.

* cited by examiner

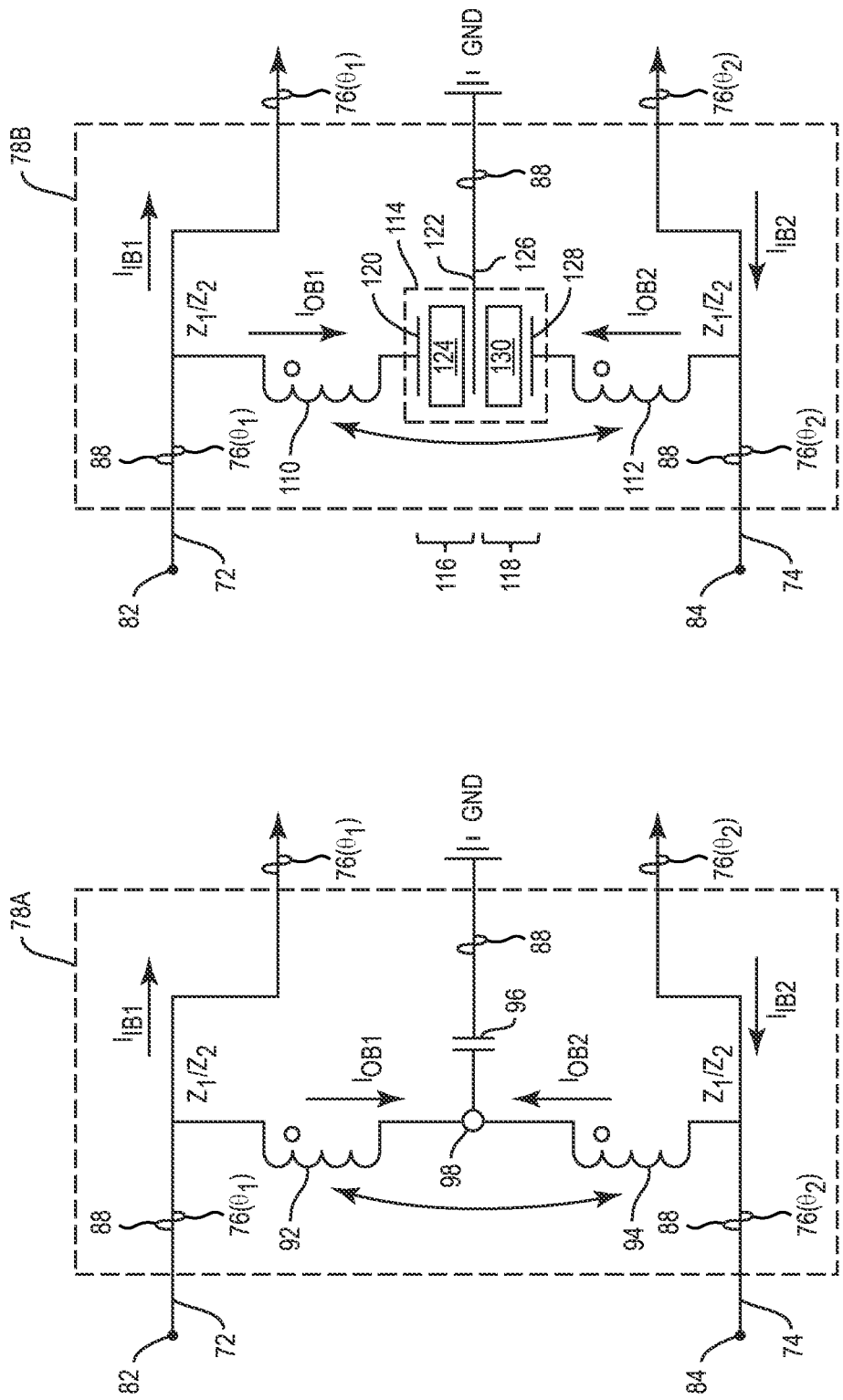

ACOUSTIC FILTER CIRCUIT FOR NOISE SUPPRESSION OUTSIDE RESONANCE FREQUENCY

RELATED APPLICATIONS

This application claims the benefit of U.S. provisional patent application Ser. No. 62/957,985, filed on Jan. 7, 2020, the disclosure of which is incorporated herein by reference in its entirety.

FIELD OF THE DISCLOSURE

The technology of the disclosure relates generally to an acoustic filter circuit capable of suppression noises outside a resonance frequency.

BACKGROUND

Wireless devices have become increasingly common in current society. The prevalence of these wireless devices is driven in part by the many functions that are now enabled on such devices for supporting a variety of wireless communication technologies in a variety of radio frequency (RF) spectrums. In this regard, a wireless device can employ a large number of RF filters to selectively pass and/or reject a selected RF spectrum(s) associated with a selected wireless communication technology.

Acoustic resonators, such as surface acoustic wave (SAW) resonators and bulk acoustic wave (BAW) resonators, are used in many high-frequency communication applications. In particular, SAW resonators are often employed in filter networks that operate frequencies up to 1.8 GHz, and BAW resonators are often employed in filter networks that operate at frequencies above 1.5 GHz. Such filters need to have flat passbands, have steep filter skirts and squared shoulders at the upper and lower ends of the passband, and provide excellent rejection outside of the passband. SAW and BAW-based filters also have relatively low insertion loss, tend to decrease in size as the frequency of operation increases, and are relatively stable over wide temperature ranges.

As such, SAW and BAW-based filters are the filters of choice for many 3rd Generation (3G) and 4th Generation (4G) wireless devices and are destined to dominate filter applications for 5th Generation (5G) wireless devices. Most of these wireless devices support cellular, wireless fidelity (Wi-Fi), Bluetooth, and/or near field communications on the same wireless device and, as such, pose extremely challenging filtering demands. While these demands keep raising the complexity of wireless devices, there is a constant need to improve the performance of acoustic resonators and filters that are based thereon.

SUMMARY

Aspects disclosed in the detailed description include an acoustic filter circuit for noise suppression outside resonance frequency. The acoustic filter circuit includes a first filter branch and a second filter branch. The first filter branch and the second filter branch are both configured to resonate at a resonance frequency to pass a radio frequency (RF) signal, but in opposite phases. The acoustic filter circuit also includes a shunt circuit coupled between the first filter branch and the second filter branch. As discussed in various embodiments in the detailed description, the shunt circuit can be configured to protect the RF signal located inside the resonance frequency and suppress noises located outside the resonance frequency. As such, the acoustic filter circuit can provide improved noise rejection and reduce insertion loss.

In one aspect, an acoustic filter circuit is provided. The acoustic filter circuit includes a first filter branch comprising an acoustic coupled resonator filter (ACRF) configured to resonate at a resonance frequency to pass an RF signal in a first phase. The acoustic filter circuit also includes a second filter branch comprising an inverted-ACRF (I-ACRF) configured to resonate at the resonance frequency to pass the RF signal in a second phase opposite the first phase. The acoustic filter circuit also includes a shunt circuit coupled between the first filter branch and the second filter branch. The shunt circuit is configured to present a first impedance between the first filter branch and the second filter branch in the resonance frequency. The shunt circuit is also configured to present a second impedance lower than the first impedance between the first filter branch and the second filter branch outside the resonance frequency.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure and, together with the description, serve to explain the principles of the disclosure.

FIG. 4A is a schematic diagram of an exemplary shunt circuit configured according to one embodiment of the present disclosure and can be provided in the acoustic filter circuit of FIG. 3 to suppress the noise signal outside a resonance frequency;

FIG. 4C is a schematic diagram of an exemplary shunt circuit configured according to another embodiment of the present disclosure and can be provided in the acoustic filter circuit of FIG. 3 to suppress the noise signal outside a resonance frequency;

DETAILED DESCRIPTION

Figure 1:
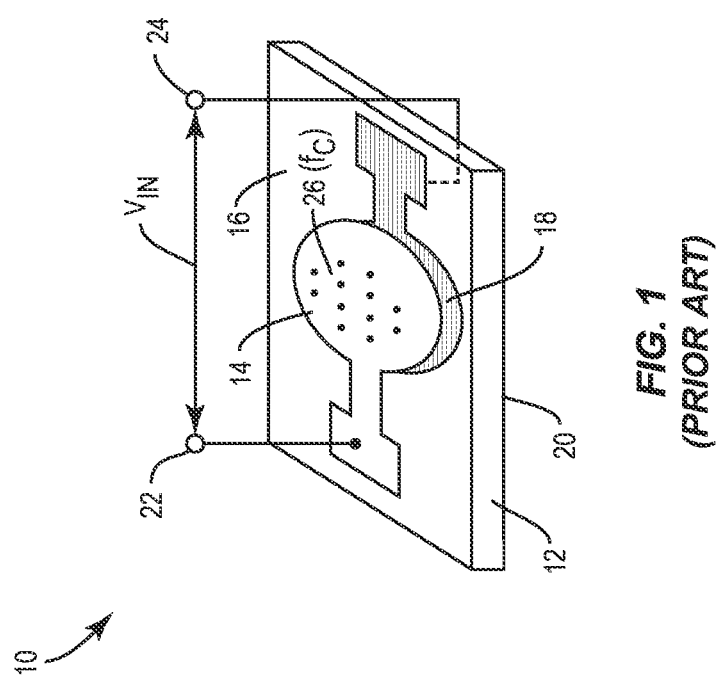
FIG. 1 is a schematic diagram of an exemplary bulk acoustic wave (BAW) resonator.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed in the detailed description include an acoustic filter circuit for noise suppression outside resonance frequency. The acoustic filter circuit includes a first filter branch and a second filter branch. The first filter branch and the second filter branch are both configured to resonate at a resonance frequency to pass a radio frequency (RF) signal, but in opposite phases. The acoustic filter circuit also includes a shunt circuit coupled between the first filter branch and the second filter branch. As discussed in various embodiments in the detailed description, the shunt circuit can be configured to protect the RF signal located inside the resonance frequency and suppress noises located outside the resonance frequency. As such, the acoustic filter circuit can provide improved noise rejection and reduce insertion loss.

Figures 2A, 2B:
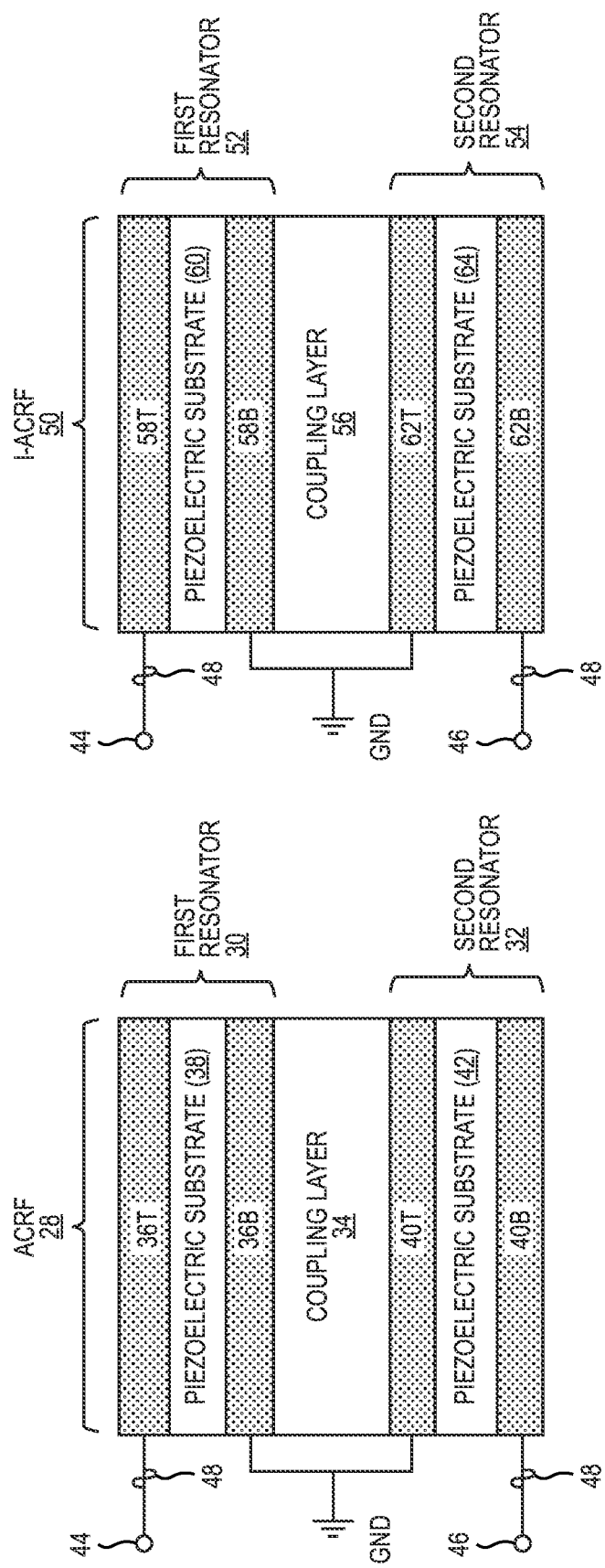
FIG. 2A is a schematic diagram of an exemplary acoustic coupled resonator filter (ACRF)
FIG. 2B is a schematic diagram of an exemplary inverted-ACRF (I-ACRF)
Figure 2C:
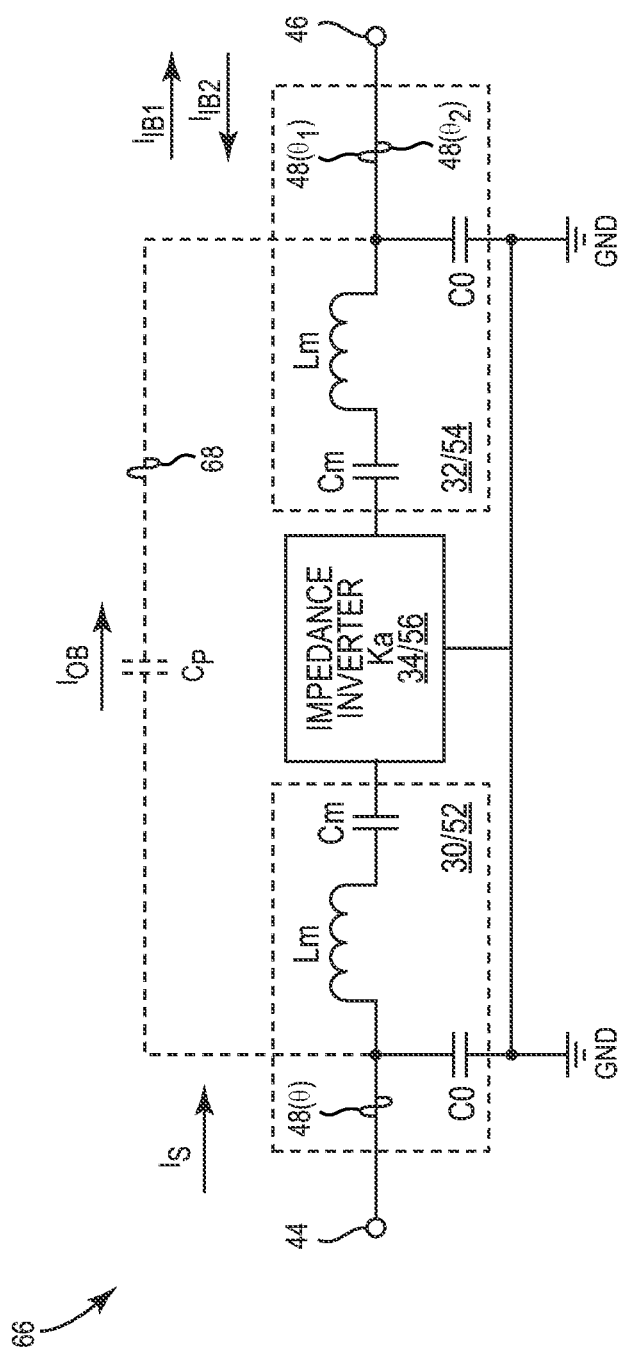
FIG. 2C is schematic diagram of an exemplary circuit illustrating an equivalent electrical model of the ACRF of FIG. 2A and the I-ACRF of FIG. 2B.
Figure 3:
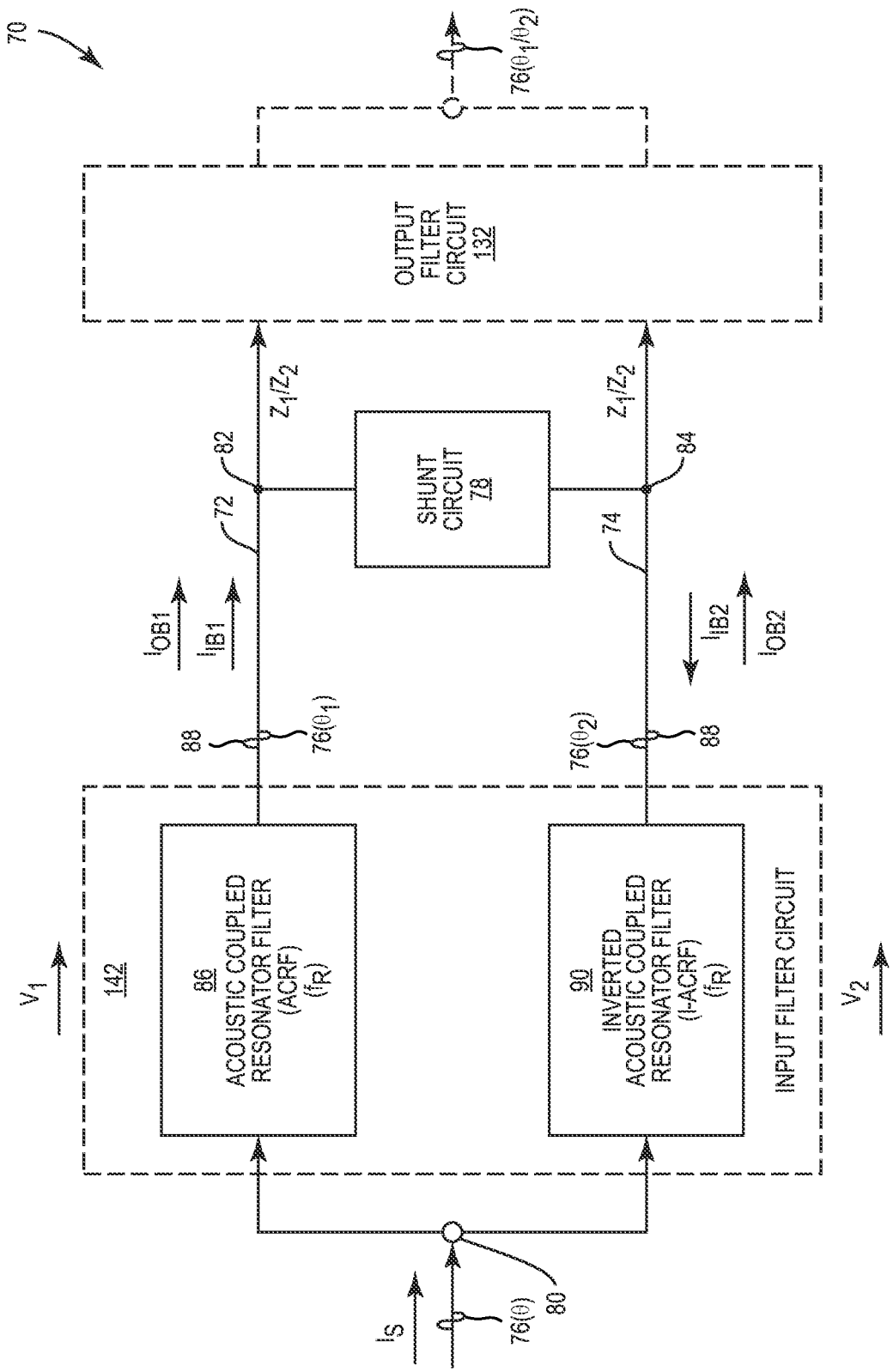
FIG. 3 is a schematic diagram of an exemplary acoustic filter circuit that can be configured according to various embodiments of the present disclosure to suppress a noise signal outside a resonance frequency of the acoustic filter circuit.

Before discussing an acoustic filter circuit of the present disclosure, starting at FIG. 3, a brief discussion of a bulk acoustic wave (BAW) resonator is first provided with reference to FIG. 1. An overview of an acoustic coupled resonator filter (ACRF) and an inverted-ACRF (I-ACRF) is then provided with reference to FIGS. 2A-2C to help establish an equivalent electrical model for the ACRF and the I-ACRF.

In this regard, FIG. 1 is a schematic diagram of an exemplary BAW resonator 10. The BAW resonator 10 includes a piezoelectric substrate 12 (e.g., a quartz crystal), a top metal electrode 14 disposed on a top surface 16 of the piezoelectric substrate 12, and a bottom metal electrode 18 disposed on a bottom surface 20 of the piezoelectric substrate 12. The top metal electrode 14 and the bottom metal electrode 18 are coupled to an input port 22 and an output port 24, respectively.

When a voltage $V_{IN}$ is applied between the input port 22 and the output port 24, an acoustic wave 26 is excited and resonates at a resonance frequency $f_C$ between the top surface 16 and the bottom surface 20 of the piezoelectric substrate 12. The resonance frequency $f_C$ may be determined by a thickness of the piezoelectric substrate 12 as well as a mass of the top metal electrode 14 and the bottom metal electrode 18.

The BAW resonator 10 may be configured to expand the piezoelectric substrate 12 when a positive voltage $V_{IN}$ is applied between the input port 22 and the output port 24 and compress the piezoelectric substrate 12 when a negative voltage $V_{IN}$ is applied between the input port 22 and the output port 24. As such, the BAW resonator 10 in which the piezoelectric substrate 12 expands and compresses respectively in response to the positive voltage $V_{IN}$ and the negative voltage $V_{IN}$ is also known as a polarized BAW resonator (a.k.a. non-inverted acoustic resonator).

Alternatively, the BAW resonator 10 may be configured to compress the piezoelectric substrate 12 when the positive voltage $V_{IN}$ is applied between the input port 22 and the output port 24 and expands the piezoelectric substrate 12 when the negative voltage $V_{IN}$ is applied between input port 22 and the output port 24. As such, the BAW resonator 10 in which the piezoelectric substrate 12 compresses and expands respectively in response to the positive voltage $V_{IN}$ and the negative voltage $V_{IN}$ is also known as a polarized inverted BAW resonator (a.k.a. inverted acoustic resonator).

FIG. 2A is a schematic diagram of an exemplary ACRF 28 formed by coupling a first resonator 30 with a second resonator 32 via a coupling layer 34. The first resonator 30 includes a first top electrode 36T, a first bottom electrode 36B, and a first piezoelectric substrate 38 provided in between the first top electrode 36T and the first bottom electrode 36B. Herein, the first piezoelectric substrate 38 may be formed by c-type Aluminum Nitride (AlN). The second resonator 32 includes a second top electrode 40T, a second bottom electrode 40B, and a second piezoelectric substrate 42 provided in between the second top electrode 40T and the second bottom electrode 40B. Herein, the second piezoelectric substrate 42 may also be formed by c-type AlN. The coupling layer 34 is provided between the first bottom electrode 36B and the second top electrode 40T. The first top electrode 36T is coupled to an input port 44 and the second bottom electrode 40B is coupled to an output port 46. The ACRF 28 is configured to resonate at a resonance frequency to pass an RF signal 48 and rejects a noise signal outside the resonance frequency.

FIG. 2B is a schematic diagram of an exemplary I-ACRF 50 formed by coupling a first resonator 52 with a second resonator 54 via a coupling layer 56. Common elements between FIGS. 2A and 2B are shown therein with common element numbers and will not be re-described herein.

The first resonator 52 includes a first top electrode 58T, a first bottom electrode 58B, and a first piezoelectric substrate 60 provided in between the first top electrode 58T and the first bottom electrode 58B. Herein, the first piezoelectric substrate 60 may be formed by c-type AlN. The second resonator 54 includes a second top electrode 62T, a second bottom electrode 62B, and a second piezoelectric substrate 64 provided in between the second top electrode 62T and the second bottom electrode 62B. Herein, the second piezoelectric substrate 64 may be formed by f-type AlN. The coupling layer 56 is provided between the first bottom electrode 58B and the second top electrode 62T. Both the first bottom electrode 58B and the second top electrode 62T are coupled to a ground (GND).

The first top electrode 58T is coupled to the input port 44 and the second bottom electrode 62B is coupled to the output port 46. The I-ACRF 50 is configured to resonate at a resonance frequency to pass the RF signal 48 and rejects a noise signal outside the resonance frequency.

The ACRF 28 of FIG. 2A and the I-ACRF 50 of FIG. 2B may be modeled by an equivalent electrical model. In this regard, FIG. 2C is a schematic diagram of an exemplary circuit 66 illustrating an equivalent electrical model of the ACRF 28 of FIG. 2A and the I-ACRF 50 of FIG. 2B. Common elements between FIGS. 2A, 2B, and 2C are shown therein with common element numbers and will not be re-described herein.

In the circuit 66, the first resonator 30 and the second resonator 32 in the ACRF 28, and the first resonator 52 and the second resonator 54 in the I-ACRF 50 can each be represented by an inductor-capacitor (LC) circuit that includes an inductor Lm, a capacitor Cm coupled in series with the inductor Lm, and a second capacitor CO coupled to the GND. In addition, the coupling layer 34 in the ACRF 28 and the coupling layer 56 in the I-ACRF 50 can each be modeled by an impedance inverter Ka.

The RF signal 48 entering the input port 44 has a respective phase θ and is associated with a signal current $I_S$. For the ACRF 28, the RF signal 48 exiting the output port 46 has a phase $θ_1$ identical to the phase θ and is associated with a respective in-band current $I_{IB1}$ flowing in a same direction as the signal current $I_S$. For the I-ACRF 50, the RF signal 48 exiting the output port 46 has a phase $θ_1$ opposite to the phase θ and is associated with a respective in-band current $I_{IB2}$ flowing in an opposite direction from the signal current $I_S$.

Notably, the first top electrode 36T and the first bottom electrode 36B of the first resonator 30 and the second top electrode 40T and the second bottom electrode 40B of the second resonator 32 can each create a parasitic capacitance between the input port 44 and the output port 46. Likewise, the first top electrode 58T and the first bottom electrode 58B of the first resonator 52 and the second top electrode 62T and the second bottom electrode 62B of the second resonator 54 can each create a parasitic capacitance between the input port 44 and the output port 46. Such parasitic capacitance can be modeled by a parasitic capacitance $C_P$ in the circuit 66.

Due to inherency of the parasitic capacitance $C_P$, an out-of-band current $I_{OB}$ may flow from the input port 44 through the output port 46 in a same direction as the signal current $I_S$. As a result, a portion of the RF signal 48 may leak from the output port 46 to cause a noise signal 68 outside the resonance frequency. In this regard, it is desirable to suppress the noise signal 68 outside the resonance frequency.

In this regard, FIG. 3 is a schematic diagram of an exemplary acoustic filter circuit 70 that can be configured according to various embodiments of the present disclosure to suppress the noise signal 68 outside a resonance frequency $f_R$ of the acoustic filter circuit 70. The acoustic filter circuit 70 includes a first filter branch 72 and a second filter branch 74 each configured to pass an RF signal 76 in the resonance frequency $f_R$. Specifically, the first filter branch 72 is configured to pass the RF signal 76 in the resonance frequency $f_R$ and with a first phase $θ_1$. The second filter branch 74 is configured to pass the RF signal 76 in the resonance frequency $f_R$ and with a second phase $θ_2$ opposite to the first phase $θ_1$. In this regard, the RF signal 76 is outputted from the first output port 82 and the second output port 84 as a differential RF signal.

The acoustic filter circuit 70 includes a shunt circuit 78 coupled between the first filter branch 72 and the second filter branch 74. As discussed in detail below, the shunt circuit 78 is configured to present a first impedance $Z_1$ between the first filter branch 72 and the second filter branch 74 inside the resonance frequency $f_R$. The shunt circuit 78 is further configured to present a second impedance $Z_2$ smaller than the first impedance $Z_1$ ($Z_2<Z_1$) between the first filter branch 72 and the second filter branch 74 outside the resonance frequency $f_R$. By presenting the higher impedance $Z_1$ inside the resonance frequency $f_R$ and the lower impedance $Z_2$ outside the resonance frequency $f_R$, the shunt circuit 78 can protect the RF signal 76 in the resonance frequency $f_R$ while suppressing a noise signal (e.g., the noise signal 68 in FIG. 2C) outside the resonance frequency $f_R$, thus helping to improve efficiency and performance of the acoustic filter circuit 70.

Hereinafter, the resonance frequency $f_R$ refers to a frequency range bounded by a lower frequency boundary and an upper frequency boundary. The RF signal 76, on the other hand, corresponds to a frequency bandwidth defined by a lower frequency and an upper frequency of the RF signal 76. In this regard, the RF signal 76 is said to be inside the resonance frequency $f_R$ when the frequency bandwidth of the RF signal 76 falls completely within the lower frequency boundary and the upper frequency boundary of the resonance frequency $f_R$. In contrast, when the frequency bandwidth of the RF signal 76 falls below the lower frequency boundary or above the upper frequency boundary of the resonance frequency $f_R$, the RF signal 76 is said to be outside the resonance frequency $f_R$ and thereby becomes the noise signal.

The acoustic filter circuit 70 includes an input port 80, a first output port 82, and a second output port 84. In this regard, the shunt circuit 78 is coupled between the first output port 82 and the second output port 84.

The input port 80 is configured to receive the RF signal 76 in a respective phase θ and a signal current $I_S$ associated with the RF signal 76. In one non-limiting example, the input port 80 is coupled to a transceiver circuit (not shown) to receive the RF signal 76 as an RF transmit signal. In this regard, the first output port 82 and the second output port 84 are coupled to a differential power amplifier (not shown) for amplifying the RF signal 76. In another non-limiting example, the input port 80 is coupled to an antenna/antenna array (not shown) to receive the RF signal 76 as an RF receive signal. In this regard, the first output port 82 and the second output port 84 are coupled to a differential low-noise amplifier (LNA) (not shown) for amplifying the RF signal 76. Notably, the differential power amplifier and/or the differential LNA can be separated from or integrated with the acoustic filter circuit 70.

The first filter branch 72 includes an ACRF 86 coupled between the input port 80 and the first output port 82. In a non-limiting example, the ACRF 86 is identical or functionally equivalent to the ACRF 28 of FIG. 2A. In this regard, the ACRF 86 is designed to resonate at the resonance frequency $f_R$ to pass the RF signal 76 and rejects the RF signal 76 outside the resonance frequency $f_R$. According to previous discussion in FIG. 2C, the RF signal 76 exiting the first output port 82 will have the first phase $\theta_1$ identical to the respective phase θ of the RF signal 76 entering the input port 80. Like the ACRF 28 in FIG. 2A, the ACRF 86 outputs a first in-band current $I_{IB1}$ and a first out-of-band current $I_{OB1}$ via the first output port 82. Both the first in-band current $I_{IB1}$ and the first out-of-band current $I_{OB1}$ flow in a same direction as the signal current $I_S$. Accordingly, the ACRF 86 will see a first voltage $V_1$ between the input port 80 and the first output port 82. The ACRF 86 also has an inherent parasitic capacitance $C_P$ (such as the $C_P$ shown in FIG. 2C) that can cause a portion of the RF signal 76 to be leaked outside the resonance frequency $f_R$ to become a noise signal 88 in the first filter branch 72.

The second filter branch 74 includes an I-ACRF 90 coupled between the input port 80 and the second output port 84. In a non-limiting example, the I-ACRF 90 is identical or functionally equivalent to the I-ACRF 50 of FIG. 2B. In this regard, the I-ACRF 90 is designed to resonate at the resonance frequency $f_R$ to pass the RF signal 76 and rejects the RF signal 76 outside the resonance frequency $f_R$. According to the previous discussion in FIG. 2C, the RF signal 76 exiting the second output port 84 will have the second phase $\theta_2$ opposite to the respective phase θ of the RF signal 76 entering the input port 80. Like the I-ACRF 50 in FIG. 2B, the I-ACRF 90 outputs a second in-band current $I_{IB2}$ and a second out-of-band current $I_{OB2}$ via the second output port 84. The second in-band current $I_{IB2}$ flows in an opposite direction from the signal current $I_S$ and the first out-of-band current $I_{OB1}$ flows in a same direction as the signal current $I_S$. Accordingly, the I-ACRF 90 will see a second voltage $V_2$ between the input port 80 and the second output port 84. The I-ACRF 90 also has an inherent parasitic capacitance $C_P$ that can cause a portion of the RF signal 76 to be leaked outside the resonance frequency $f_R$ to become the noise signal 88 in the second filter branch 74.

Since the first in-band current $I_{IB1}$ and the second in-band current $I_{IB2}$ flow in opposite directions, the first in-band current $I_{IB1}$ and the second in-band current $I_{IB2}$ are said to have opposite polarities ($V_1=-V_2$). As such, the first voltage $V_1$ and the second voltage $V_2$ are also in opposite polarities. In this regard, it can be said that the first voltage $V_1$ and the second voltage $V_2$ have opposite polarities inside the resonance frequency $f_R$.

In contrast, the second out-of-band current $I_{OB2}$ flows in a same direction as the first out-of-band current $I_{OB1}$ and thus has an identical polarity as the first out-of-band current $I_{OB1}$. Accordingly, the first voltage $V_1$ and the second voltage $V_2$ are also in same polarities ($V_1=V_2$). In this regard, it can be said that the first voltage $V_1$ and the second voltage $V_2$ have identical polarities outside the resonance frequency $f_R$.

In an alternative configuration, it is also possible to configure the first filter branch 72 to include the I-ACRF 90 and the second filter branch 74 to include the ACRF 86. In this regard, the RF signal 76 exiting the first output port 82 has the first phase $\theta_1$ opposite to the respective phase θ of the RF signal 76 entering the input port 80. In contrast, the RF signal 76 exiting the second output port 84 has the second phase $\theta_2$ identical to the respective phase θ of the RF signal 76 entering the input port 80.

Regardless of how the first filter branch 72 and the second filter branch 74 are configured, the shunt circuit 78 will always present the higher impedance $Z_1$ in the resonance frequency $f_R$ and the lower impedance $Z_2$ outside the resonance frequency $f_R$. In this regard, FIG. 4A is a schematic diagram of an exemplary shunt circuit 78A configured according to one embodiment of the present disclosure and can be provided in the acoustic filter circuit 70 of FIG. 3 as the shunt circuit 78 to suppress the noise signal 88 outside the resonance frequency $f_R$. Common elements between FIGS. 3 and 4A are shown therein with common element numbers and will not be re-described herein.

The shunt circuit 78A includes a first inductor 92 and a second inductor 94 that are negatively coupled in series between the first output port 82 and the second output port 84. The shunt circuit 78A also includes a capacitor 96 coupled between a ground (GND) and a coupling point 98 located in between the first inductor 92 and the second inductor 94. As discussed in detail below, the shunt circuit 78A presents the higher impedance $Z_1$ between the first output port 82 and the second output port 84 when the first in-band current $I_{IB1}$ and the second in-band current $I_{IB2}$ have different polarities. Due to the higher impedance $Z_1$ presented between the first output port 82 and the second output port 84, the first in-band current $I_{IB1}$ and the second in-band current $I_{IB2}$ will not be shunted to the GND, thus helping to protect the RF signal 76 inside the resonance frequency $f_R$.

In contrast, the shunt circuit 78A presents the lower impedance $Z_2$ between the first output port 82 and the second output port 84 in response to the out-of-band current $I_{OB}$ flowing through the first filter branch 72 and the out-of-band current $I_{OB}$ flowing through the second filter branch 74 having identical polarities. As a result, the shunt circuit 78A can shunt the out-of-band current $I_{OB}$ to the GND, thus helping to suppress the noise signal 88 outside the resonance frequency $f_R$.

Figure 4B:
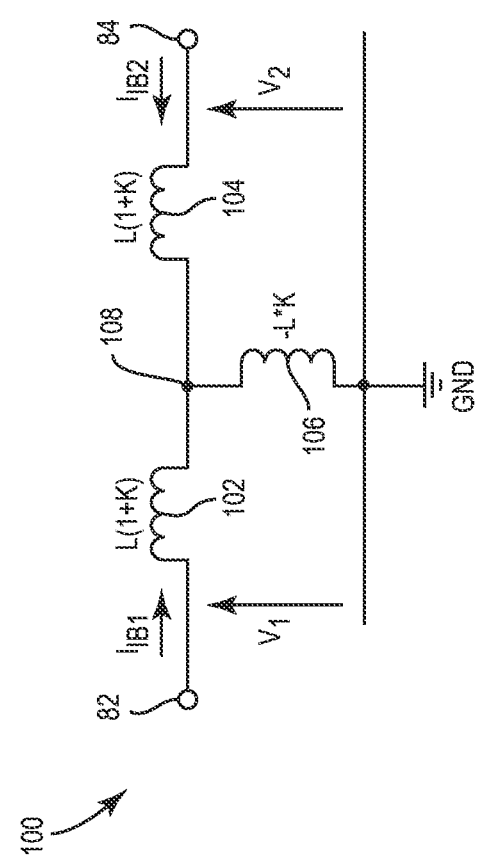
FIG. 4B is schematic diagram of an exemplary inductor network illustrating an equivalent electrical model of the shunt circuit of FIG. 4A.

The first inductor 92 and the second inductor 94 in the shunt circuit 78A can be modeled by an equivalent electrical model. In this regard, FIG. 4B is a schematic diagram of an exemplary inductor network 100 illustrating an equivalent electrical model of the shunt circuit 78A of FIG. 4A. Common elements between FIGS. 4A and 4B are shown therein with common element numbers and will not be re-described herein.

The inductor network 100 includes a first equivalent inductor 102 and a second equivalent inductor 104 coupled in series between the first output port 82 and the second output port 84. The inductor network 100 also includes a third equivalent inductor 106 coupled in between a coupling point 108 and the GND. From the equivalent electrical model illustrated by the inductor network 100, it is possible to establish the following equations.

$$V_1 = j*L*w*(1+k)*I_{IB1} - j*L*k*w*(I_{IB1}+I_{IB2}) \quad \text{(Eq. 1)}$$

$$V_2 = j*L*w*(1+k)*I_{IB2} - j*L*k*w*(I_{IB1}+I_{IB2}) \quad \text{(Eq. 2)}$$

$$I_{IB1} = (V_1 + k*V_2)/(j*L*w*(1-k^2)) \quad \text{(Eq. 3)}$$

$$I_{IB2} = (V_2 + k*V_1)/(j*L*w*(1-k^2)) \quad \text{(Eq. 4)}$$

In the equations (Eq. 1 to 4), w represents a pulsation frequency and L represents a respective inductance of the first equivalent inductor 102, the second equivalent inductor 104, and the third equivalent inductor 106. As mentioned earlier, the first voltage $V_1$ and the second voltage $V_2$ will have opposite polarities inside the resonance frequency $f_R$. In contrast, the first voltage $V_1$ and the second voltage $V_2$ will have identical polarities outside the resonance frequency $f_R$.

In this regard, if $V_1 = -V_2$, the inductor network 100 will present the first impedance $Z_1$ as shown in equation (Eq. 5) below.

$$Z_1 = V_1/I_{IB1} = V_2/I_{IB2} = j*L*w*(1+k) \quad \text{(Eq. 5)}$$

In contrast, if $V_1 = V_2$, the inductor network 100 will present the second impedance $Z_2$ as shown in equation (Eq. 6) below.

$$Z_2 = V_1/I_{IB1} = V_2/I_{IB2} = j*L*w*(1-k) \quad \text{(Eq. 6)}$$

Clearly, from the equations (Eq. 5 and 6), the second impedance $Z_2$ is smaller than the first impedance $Z_1$. As such, the inductor network 100 proves that the shunt circuit 78A in FIG. 4A can present the higher impedance $Z_1$ inside the resonance frequency $f_R$ and the lower impedance $Z_2$ outside the resonance frequency $f_R$.

FIG. 4C is a schematic diagram of an exemplary shunt circuit 78B configured according to another embodiment of the present disclosure and can be provided in the acoustic filter circuit 70 of FIG. 3 as the shunt circuit 78 to suppress the noise signal 88 outside the resonance frequency $f_R$. Common elements between FIGS. 3 and 4A are shown therein with common element numbers and will not be re-described herein.

The shunt circuit 78B includes a first inductor 110 coupled to the first output port 82 and a second inductor 112 coupled to the second output port 84. The shunt circuit 78B also includes a shunt I-ACRF 114 coupled between the first inductor 110 and the second inductor 112. In a non-limiting example, the shunt I-ACRF 114 includes a first resonator 116 and a second resonator 118. The first resonator 116 includes a first electrode 120 coupled to the first inductor 110, a second electrode 122 coupled to the GND, and a first piezoelectric substrate 124 disposed between the first electrode 120 and the second electrode 122. The second resonator 118 includes a third electrode 126 coupled to the GND, a fourth electrode 128 coupled to the second inductor 112, and a second piezoelectric substrate 130 coupled between the third electrode 126 and the fourth electrode 128.

In one example, the first piezoelectric substrate 124 is formed by c-type AlN and the second piezoelectric substrate 130 is formed by f-type AlN. Alternative, the first piezoelectric substrate 124 is formed by f-type AlN and the second piezoelectric substrate 130 is formed by c-type AlN.

The shunt I-ACRF 114 is configured to pass the noise signal 88 outside the resonance frequency $f_R$ and block the RF signal 76 inside the resonance frequency $f_R$. In this regard, the shunt circuit 78B can protect the RF signal 76 inside the resonance frequency $f_R$ and shunt the noise signal 88 outside the resonance frequency $f_R$.

With reference back to FIG. 3, the acoustic filter circuit 70 may include an output filter circuit 132 coupled to the first output port 82 and the second output port 84. The output filter circuit 132 may be configured according to different embodiments of the present disclosure to output the RF signal 76 in one of the first phase $\theta_1$ and the second phase $\theta_2$.

Figure 5B:
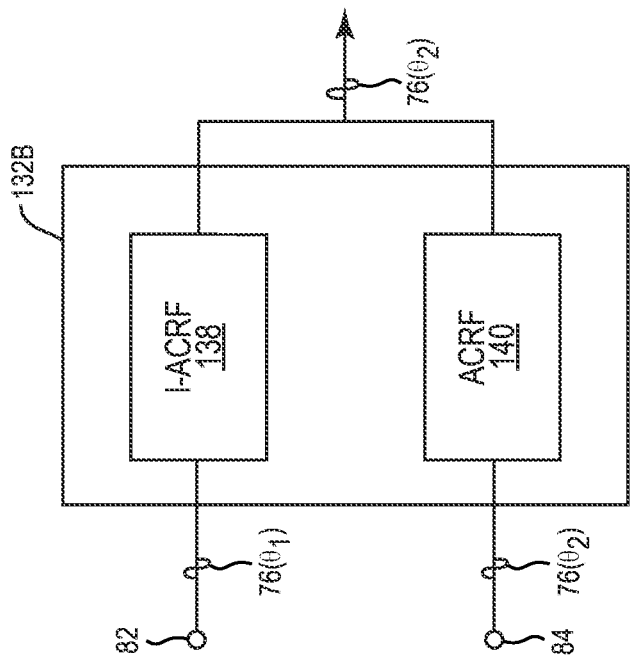
FIG. 5B is a schematic diagram of another exemplary output filter circuit in the acoustic filter circuit of FIG. 3.
Figure 5A:
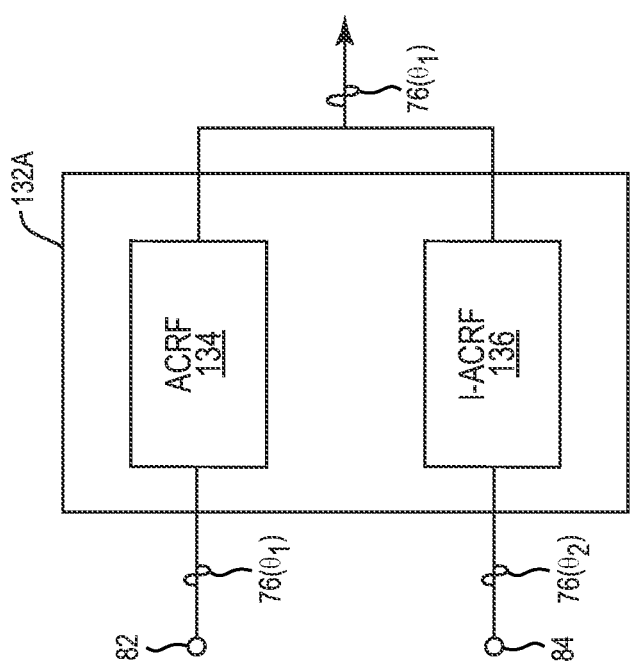
FIG. 5A is a schematic diagram of an exemplary output filter circuit in the acoustic filter circuit of FIG. 3.

FIG. 5A is a schematic diagram of an exemplary output filter circuit 132A in the acoustic filter circuit 70 of FIG. 3. Common elements between FIGS. 3 and 5A are shown therein with common element numbers and will not be re-described herein.

The output filter circuit 132A includes an output ACRF 134 coupled to the first output port 82 and an output I-ACRF 136 coupled to the second output port 84. The output ACRF 134 is configured to resonate at the resonance frequency $f_R$ to output the RF signal 76 in the first phase $\theta_1$. The output I-ACRF 136 is configured to resonate at the resonance frequency $f_R$ to invert the RF signal 76 from the second phase $\theta_2$ to the first phase $\theta_1$. As a result, the output filter circuit 132A ultimately outputs the RF signal 76 in the first phase $\theta_1$.

FIG. 5B is a schematic diagram of another exemplary output filter circuit 132B in the acoustic filter circuit 70 of FIG. 3. Common elements between FIGS. 3 and 5B are shown therein with common element numbers and will not be re-described herein.

The output filter circuit 132B includes an output I-ACRF 138 coupled to the first output port 82 and an output ACRF 140 coupled to the second output port 84. The output I-ACRF 138 is configured to resonate at the resonance frequency $f_R$ to invert the RF signal 76 from the first phase $\theta_1$ to the second phase $\theta_2$. The output ACRF 140 is configured to resonate at the resonance frequency $f_R$ to output the RF signal 76 in the second phase $\theta_2$. As a result, the output filter circuit 132B ultimately outputs the RF signal 76 in the second phase $\theta_2$.

Figure 6:
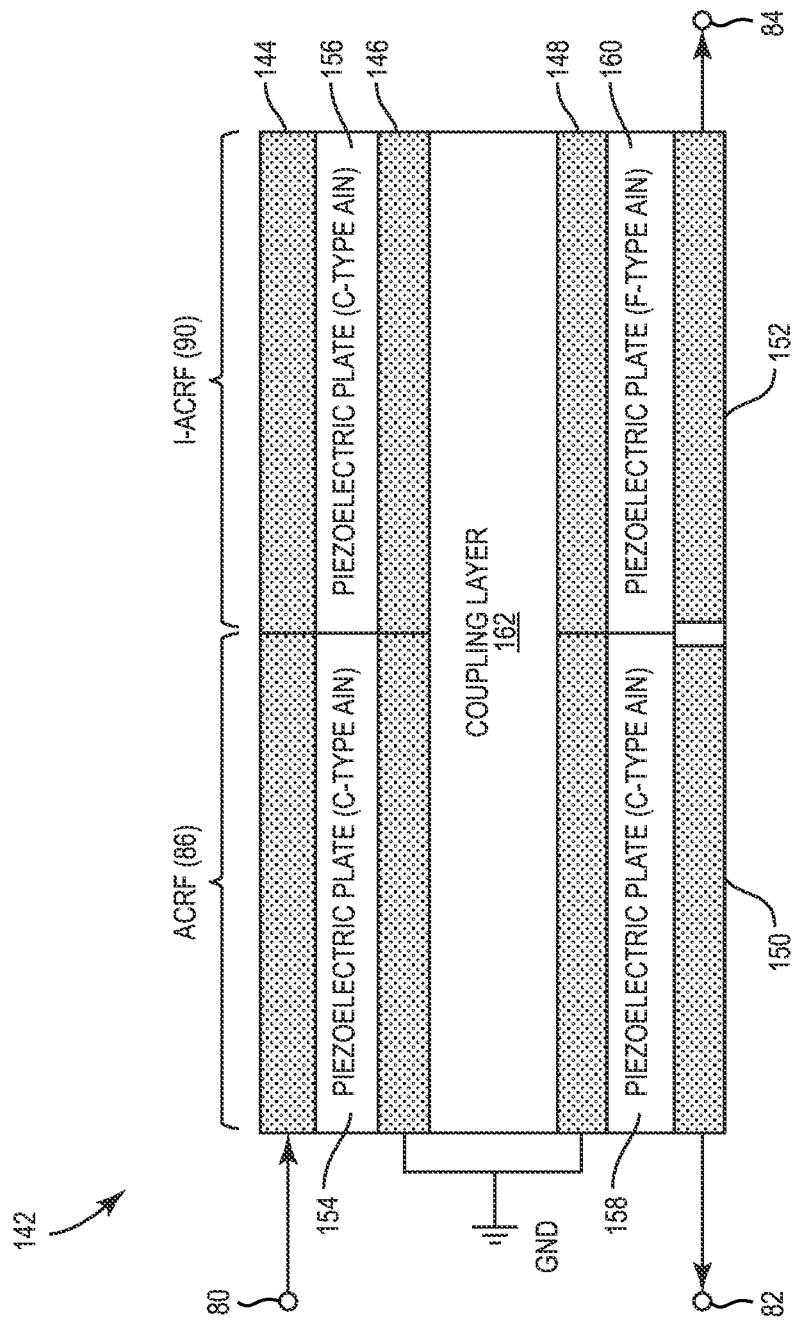
FIG. 6 is a schematic diagram providing an exemplary illustration of an integrated input filter circuit that can help reduce footprint of the acoustic filter circuit in FIG. 3.

With reference back to FIG. 3, in a non-limiting example, the ACRF 86 and the I-ACRF 90 can be integrated into an input filter circuit 142 to help reduce footprint of the acoustic filter circuit 70. In this regard, FIG. 6 is a schematic diagram providing an exemplary illustration of the input filter circuit 142 in FIG. 3. Common elements between FIGS. 3 and 6 are shown therein with common element numbers and will not be re-described herein.

The input filter circuit 142 includes a first electrode 144 coupled to the input port 80, a second electrode 146 coupled to the GND, a third electrode 148 coupled to the GND, a fourth electrode 150 coupled to the first output port 82, and a fifth electrode 152 coupled to the second output port 84. The input filter circuit 142 also includes a first piezoelectric region 154, a second piezoelectric region 156, a third piezoelectric region 158, and a fourth piezoelectric region 160. The first piezoelectric region 154 and the second piezoelectric region 156 are both disposed between the first electrode 144 and the second electrode 146. The third piezoelectric region 158 is disposed between the third electrode 148 and the fourth electrode 150. The fourth piezoelectric region 160 is disposed between the third electrode 148 and the fifth electrode 152. The input filter circuit 142 further includes a coupling layer 162, which is disposed between the second electrode 146 and the third electrode 148.

In a non-limiting example, the first piezoelectric region 154, the second piezoelectric region 156, and the third piezoelectric region 158 are all formed by c-type AlN, while the fourth piezoelectric region 160 is formed by f-type AlN. In this regard, the first electrode 144, the first piezoelectric region 154, the second electrode 146, the coupling layer 162, the third electrode 148, the third piezoelectric region 158, and the fourth electrode 150 collectively form the ACRF 86. Similarly, the first electrode 144, the second piezoelectric region 156, the second electrode 146, the coupling layer 162, the third electrode 148, the fourth piezoelectric region 160, and the fifth electrode 152 collectively form the I-ACRF 90.

Figure 7:
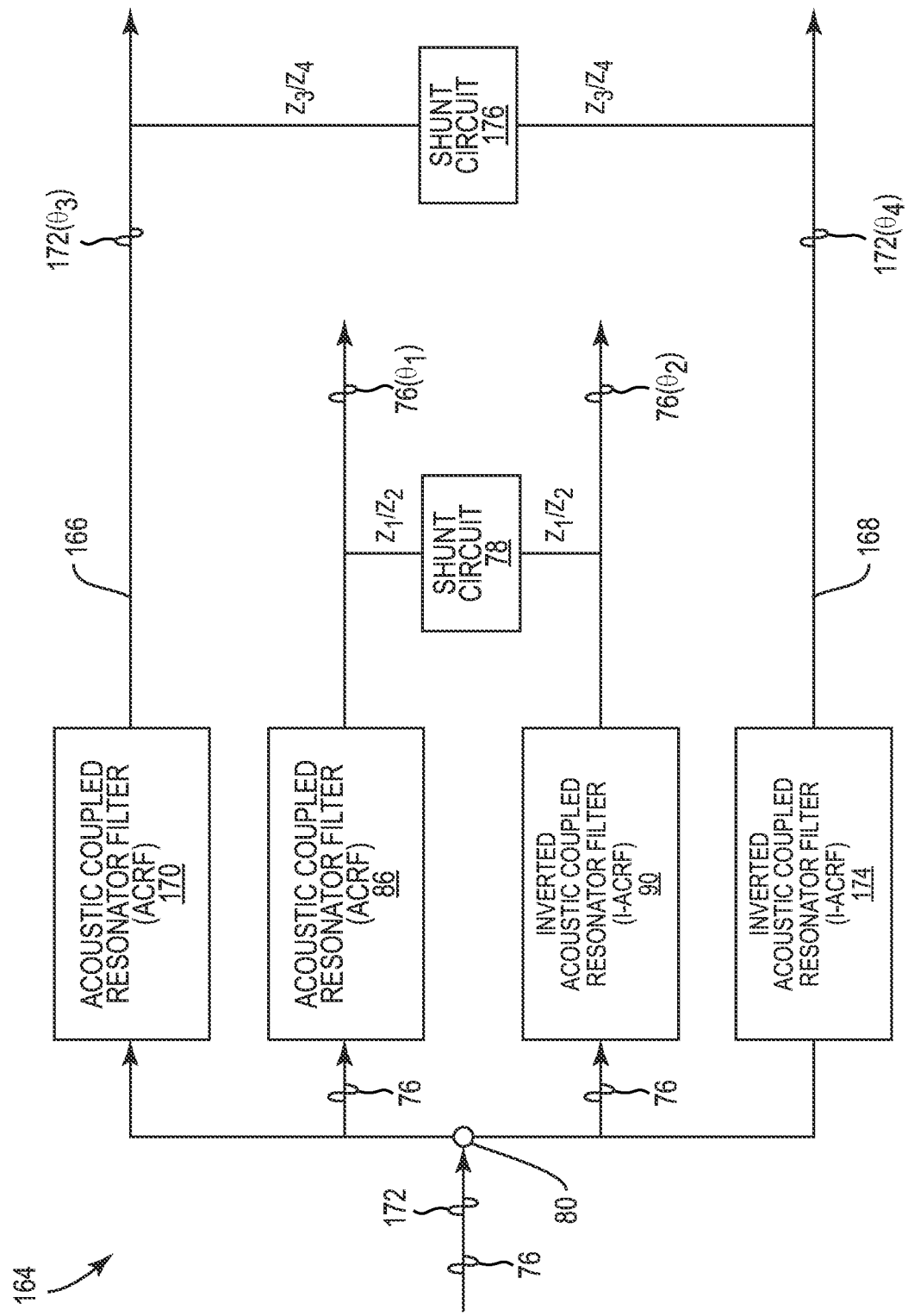
FIG. 7 is a schematic diagram of an exemplary multi-band acoustic filter circuit configured according to an embodiment of the present disclosure.

The acoustic filter circuit 70 of FIG. 3 can be adapted to form a multi-band acoustic filter circuit. In this regard, FIG. 7 is a schematic diagram of an exemplary multi-band acoustic filter circuit 164 configured according to an embodiment of the present disclosure. Common elements between FIGS. 3 and 7 are shown therein with common element numbers and will not be re-described herein.

In a non-limiting example, the multi-band acoustic filter circuit 164 includes a third filter branch 166 and a fourth filter branch 168. The third filter branch 166 includes a second ACRF 170 configured to resonate at a second resonance frequency $f'_R$ to pass a second RF signal 172 in a third phase $\theta_3$. The fourth filter branch 168 includes a second I-ACRF 174 configured to resonate at the second resonance frequency $f'_R$ to pass the second RF signal 172 in a fourth phase $\theta_4$ opposite to the third phase $\theta_3$. Notably, the second resonance frequency $f'_R$ is different from and does not overlap with the first resonance frequency $f_R$.

The multi-band acoustic filter circuit 164 also includes a second shunt circuit 176 coupled between the third filter branch 166 and the fourth filter branch 168. The second shunt circuit 176 is configured to present a third impedance $Z_3$ between the third filter branch 166 and the fourth filter branch 168 in the second resonance frequency $f'_R$. The second shunt circuit 176 is further configured to present a fourth impedance $Z_4$, which is lower than the third impedance $Z_3$, between the third filter branch 166 and the fourth filter branch 168 outside the second resonance frequency $f'_R$.

Those skilled in the art will recognize improvements and modifications to the embodiments of the present disclosure. All such improvements and modifications are considered within the scope of the concepts disclosed herein and the claims that follow.

What is claimed is:

1. An acoustic filter circuit comprising:
   a first filter branch comprising an acoustic coupled resonator filter (ACRF) configured to resonate at a resonance frequency to pass a radio frequency (RF) signal in a first phase;
   a second filter branch comprising an inverted-ACRF (I-ACRF) configured to resonate at the resonance frequency to pass the RF signal in a second phase opposite to the first phase; and
   a shunt circuit coupled between the first filter branch and the second filter branch and configured to:
   present a first impedance between the first filter branch and the second filter branch in the resonance frequency; and
   present a second impedance lower than the first impedance between the first filter branch and the second filter branch outside the resonance frequency.

2. The acoustic filter circuit of claim 1 further comprising:
   an input port coupled to the first filter branch and the second filter branch and configured to receive and provide the RF signal to the first filter branch and the second filter branch;
   a first output port coupled to the first filter branch and configured to output the RF signal in the first phase; and
   a second output port coupled to the second filter branch and configured to output the RF signal in the second phase;
   wherein the shunt circuit is coupled between the first output port and the second output port.

3. The acoustic filter circuit of claim 2 wherein the RF signal is an RF transmit signal and the first output port and the second output port are coupled to a differential power amplifier configured to amplify the RF transmit signal.

4. The acoustic filter circuit of claim 3, wherein the differential power amplifier is integrated with the acoustic filter circuit.

5. The acoustic filter circuit of claim 2 wherein the RF signal is an RF receive signal and the first output port and the second output port are coupled to a differential low-noise amplifier (LNA) configured to amplify the RF receive signal.

6. The acoustic filter circuit of claim 5, wherein the differential LNA is integrated with the acoustic filter circuit.

7. The acoustic filter circuit of claim 2 wherein the shunt circuit comprises:
   a first inductor and a second inductor negatively coupled in series between the first output port and the second output port; and
   a capacitor coupled between a ground and a coupling point located in between of the first inductor and the second inductor.

8. The acoustic filter circuit of claim 7 wherein the shunt circuit is further configured to:
   present the first impedance between the first output port and the second output port in response to a first in-band current flowing through the first output port having a different polarity from a second in-band current flowing through the second output port; and
   present the second impedance between the first output port and the second output port in response to a first out-of-band current flowing through the first output port having an identical polarity as a second out-of-band current flowing through the second output port.

9. The acoustic filter circuit of claim 2 wherein the shunt circuit comprises:
   a first inductor coupled to the first output port;
   a second inductor coupled to the second output port; and
   a shunt I-ACRF comprising:
   a first resonator comprising a first electrode coupled to the first inductor, a second electrode coupled to a ground, and a first piezoelectric substrate disposed between the first electrode and the second electrode; and
   a second resonator comprising a third electrode coupled to the ground, a fourth electrode coupled to the second inductor, and a second piezoelectric substrate disposed between the third electrode and the fourth electrode.

10. The acoustic filter circuit of claim 9 wherein:
the first piezoelectric substrate comprises a c-type Aluminum Nitride (AlN) substrate; and
the second piezoelectric substrate comprises an f-type AlN substrate.

11. The acoustic filter circuit of claim 9 wherein:
the first piezoelectric substrate comprises an f-type Aluminum Nitride (AlN) substrate; and
the second piezoelectric substrate comprises a c-type AlN substrate.

12. The acoustic filter circuit of claim 9 wherein the shunt circuit is further configured to:
present the first impedance between the first output port and the second output port in response to the RF signal being inside the resonance frequency; and
present the second impedance between the first output port and the second output port in response to the RF signal being outside the resonance frequency.

13. The acoustic filter circuit of claim 1 further comprising an output filter circuit coupled to the first filter branch and the second filter branch and configured to output the RF signal in one of the first phase and the second phase.

14. The acoustic filter circuit of claim 13 wherein the output filter circuit comprises:
an output ACRF coupled to the first filter branch and configured to resonate at the resonance frequency to output the RF signal in the first phase; and
an output I-ACRF coupled to the second filter branch and configured to resonate at the resonance frequency to invert the RF signal from the second phase to the first phase.

15. The acoustic filter circuit of claim 13 wherein:
an output I-ACRF coupled to the first filter branch and configured to resonate at the resonance frequency to invert the RF signal from the first phase to the second phase; and
an output ACRF coupled to the second filter branch and configured to resonate at the resonance frequency to output the RF signal in the second phase.

16. The acoustic filter circuit of claim 1 wherein the ACRF in the first filter branch and the I-ACRF in the second filter branch are integrated into an input filter circuit.

17. The acoustic filter circuit of claim 16 wherein the input filter circuit comprises:
a first electrode, a second electrode, a third electrode, a fourth electrode, and a fifth electrode;
a first piezoelectric region and a second piezoelectric region disposed between the first electrode and the second electrode;
a third piezoelectric region disposed between the third electrode and the fourth electrode;
a fourth piezoelectric region disposed between the third electrode and the fifth electrode; and
a coupling layer disposed between the second electrode and the third electrode;
wherein:
the first electrode, the first piezoelectric region, the second electrode, the coupling layer, the third electrode, the third piezoelectric region, and the fourth electrode are configured to collectively form the ACRF; and
the first electrode, the second piezoelectric region, the second electrode, the coupling layer, the third electrode, the fourth piezoelectric region, and the fifth electrode are configured to collectively form the I-ACRF.

18. The acoustic filter circuit of claim 17 wherein:
the first piezoelectric region, the second piezoelectric region, and the third piezoelectric region are each formed by a c-type Aluminum Nitride (AlN) substrate; and
the fourth piezoelectric region is formed by an f-type AlN substrate.

19. The acoustic filter circuit of claim 1 further comprising:
a third filter branch comprising a second ACRF configured to resonate at a second resonance frequency to pass a second RF signal in a third phase;
a fourth filter branch comprising a second I-ACRF configured to resonate at the second resonance frequency to pass the second RF signal in a fourth phase opposite to the third phase; and
a second shunt circuit coupled between the third filter branch and the fourth filter branch and configured to:
present a third impedance between the third filter branch and the fourth filter branch in the second resonance frequency; and
present a fourth impedance lower than the third impedance between the third filter branch and the fourth filter branch outside the second resonance frequency.

20. The acoustic filter circuit of claim 19 wherein the second resonance frequency does not overlap with the resonance frequency.

* * * * *

UNITED STATES PATENT AND TRADEMARK OFFICE
CERTIFICATE OF CORRECTION

PATENT NO. : 11,757,430 B2
APPLICATION NO. : 17/141678
DATED : September 12, 2023
INVENTOR(S) : Nadim Khlat It is certified that error appears in the above-identified patent and that said Letters Patent is hereby corrected as shown below:

In the Specification

In Column 5, Line 60, replace "second capacitor CO" with --second capacitor C0--.

In Column 10, Line 49, replace "filter circuit 1328" with --filter circuit 132B--.

In the Claims

In Column 14, Line 23, replace "Aluminum Nitride (AIN)" with --Aluminum Nitride (AlN)--.

Signed and Sealed this
Twenty-fourth Day of October, 2023

Katherine Kelly Vidal
*Director of the United States Patent and Trademark Office*